(12) United States Patent
Kim et al.

(10) Patent No.: US 6,403,419 B1
(45) Date of Patent: Jun. 11, 2002

(54) METHOD OF MANUFACTURING A FLASH MEMORY DEVICE

(75) Inventors: Ki Jun Kim, Seoul; Young Ki Shin, Ichon; Byung Soo Park, Seoul; Hee Youl Lee, Ichon, all of (KR)

(73) Assignee: Hyundai Electronics Industries Co., Ltd., Kyungki (KR)

( * ) Notice: Subject to any disclaimer, the term of this patent is extended or adjusted under 35 U.S.C. 154(b) by 0 days.

(21) Appl. No.: 09/717,049

(22) Filed: Nov. 22, 2000

(30) Foreign Application Priority Data

Dec. 27, 1999 (KR) .............................. 99-62944

(51) Int. Cl.[7] ........................................... H01L 21/336
(52) U.S. Cl. ..................... 438/257; 438/264; 438/265
(58) Field of Search ................................ 438/257, 264, 438/265

(56) References Cited

U.S. PATENT DOCUMENTS 6,037,223 A * 3/2000 Su et al. ...................... 438/257
6,117,728 A * 9/2000 Kauffman et al. ........... 438/257
6,143,606 A * 11/2000 Wang et al. ................. 438/257
6,180,461 B1 * 1/2001 Ogura ......................... 438/266
6,259,131 B1 * 7/2001 Sung et al. .................. 257/315

* cited by examiner

Primary Examiner—T. N. Quach
(74) Attorney, Agent, or Firm—Pennie & Edmonds LLP

(57) ABSTRACT

There is disclosed a method of manufacturing a flash memory device by which an insulating film spacer is formed on both sidewalls of a gate electrode and a drain region is then formed. Thus, the present invention can improve coverage during a deposition process for forming a select gate and reduce the overlapping area of a floating gate and a drain region. Therefore, as the resistance of the select gate itself is reduced depending on the coverage, the present invention can increase the operating speed of a device and can improve the erase characteristic by F-N tunneling due to reduced overlapping area.

13 Claims, 7 Drawing Sheets

METHOD OF MANUFACTURING A FLASH MEMORY DEVICE

FIELD OF THE INVENTION

The invention relates generally to a method of manufacturing a flash memory device, and more particularly to, a method of manufacturing a flash memory device capable of improving the operation speed and the erase characteristic of a split-type memory cell.

BACKGROUND OF THE INVENTION

In general, a flash memory cell can be divided into a stack type and a split type depending on what shape a gate electrode has. A method of manufacturing a conventional flash memory device consisted of a flash memory cell having a split type gate electrode will be below explained.

FIGS. 1A to 1G are cross-sectional views of a device for explaining a method of manufacturing a conventional flash memory device.

FIG. 1A shows a cross-sectional view of a device in which after a gate electrode in which a tunnel oxide film 2, a floating gate 3, a dielectric film 4 and a control gate 5 are stacked is formed on a semiconductor substrate 1, a protection film 6 and a anti-reflection prevention film 7 are then formed on the gate electrode sequentially, wherein the protection film 6 is formed of an oxide film like TEOS and the anti-reflection prevention film 7 is formed of a nitride oxide film.

FIG. 1B shows a cross-sectional view of a device in which after a first photoresist 8 is formed, the first photoresist 8 is patterned to expose a portion of the semiconductor substrate 1 on which a drain region will be formed for forming a drain region having a double doped drain (DDD) structure, and an impurity ion such as phosphorous (P) is then implanted into the exposed portion of the semiconductor substrate 1.

FIG. 1C shows a cross-sectional view of a device in which after the first photoresist 8 removed, a second photoresist 9 is formed on the entire surfaces, the second photoresist 9 is patterned to expose a portion of the semiconductor substrate 1 on which the drain region and a source region will be formed and impurity ions such as arsenic (As) are then implanted into the exposed portion of the semiconductor substrate 1 to form a source region 10A and a drain region 10B. At this time, the drain region 10B has a DDD structure by the impurity ions implantation in FIG. 1B.

FIG. 1D shows a cross-sectional view of a device in which after the second photoresist 9 is removed, an oxide film 11 is formed on the sidewalls of the floating gate 3 and the control gate 5 and on the surface of the semiconductor substrate 1 by oxidization process and an insulating film 12 is then formed on the entire surfaces. At this time, the oxide film 11 formed on the surfaces of the source and drain regions 10A and 10B by the implanted ions is thicker than other portions.

FIG. 1E shows a cross-sectional view of a device in which after a third photoresist 13 is formed on the entire surfaces, the third photoresist 13 is patterned so that the photoresist can be remained only on the portion including the drain region 10B and the exposed insulating film 12 is then blanket-etched to form an insulating spacer 12A on the sidewalls of the gate electrode.

FIG. 1F shows a cross-sectional view of a device in which after the oxide film 11 remained on the surface of the semiconductor substrate 1 and the third photoresist 13 are sequentially removed, a select gate oxide film 14 is formed on the exposed semiconductor substrate 1.

FIG. 1G show a cross-sectional view of a device taken along line A1–A2 in FIG. 2, in which polysilicon and tungsten silicide are sequentially deposited on the entire surfaces to form a select gate consisted of a polysilicon layer 15 and a tungsten silicide layer 16.

In FIG. 2, a reference numeral 40 indicates a mask for forming a device isolation film and a reference numeral 41 indicates a mask for patterning a polysilicon layer for forming a floating gate.

However, the above-mentioned conventional method has the following problems.

Firstly, in the above processes, during a mask process for forming the insulating film spacer 12A, the third photoresist 13 is remained only on the gate electrode formed on both sides of the drain region 10B and the drain region 10B. Therefore, if the distance between the gate electrodes is about 0.44/2 µm, the space between the gate electrodes will be reduced to 0.15 µm by means of the remained insulating film 12. Thus, during the deposition process for forming the tungsten silicide layer 16, an over-hang phenomenon is generated which causes an insufficient coverage. This phenomenon is severe at the portion in which the insulating film spacer 12A is not formed, thus causing irregular thickness and disconnection of the tungsten silicide layer 16. Also, this defected tungsten silicide layer 16 is disconnected by oxidization during a subsequent thermal process. Therefore, due to these problems, the self-resistance Rs of the select gate (word line) is increased and a time delay by which a select gate bias is not transferred within a desired time (90 nsec in case of 0.6 µm) is thus generated, thus lowering the throughput of a device.

Additionally, if the third photoresist 13 is patterned to expose the drain region 10B, during the etching process for removing the oxide film 11, the etchers such as BOE is penetrated into the bottom of the insulating film spacer, thus causing an under-cut phenomenon. Thus, there is a problem that the exposed floating gate 3 and control gate 5 come in contact with the select gate.

Secondly, the flash memory cell is erased by F-N tunneling method which employs an electric field generated by the difference between the potential applied to the control gate 5 and the potential applied to the drain region 10B. Thus, as the overlapping area of the floating gate 3 and the drain region 10B becomes smaller, a good characteristic can be obtained. In other words, as the overlapping area is smaller, the electric field is increased and the tunneling effect is relatively increased, resulting in a good characteristic. However, as the overlapping area of the conventional memory cell is wide to be 0.145 µm, its erase characteristic is bad. Therefore, it is difficult to reduce the overlapping area by the above-mentioned method.

SUMMARY OF THE INVENTION

It is therefore an object of the present invention to provide a method of manufacturing a flash memory device capable of solving the above drawbacks, by forming insulating film spacers on both sidewalls of a gate electrode and then forming a drain region.

In order to accomplish the above object, a method of manufacturing a flash memory device according to the present invention is characterized in that it comprises the steps of forming a gate electrode in which a tunnel oxide film, a floating gate, a dielectric film and a control gate are stacked on a semiconductor substrate and then sequentially forming a protection film and an anti-reflection preventing film on the gate electrode, forming a first mask to expose a portion of the semiconductor substrate in which a source region will be formed and performing ion implantation process, after removing the first mask, forming an insulating film on the entire surfaces to form an oxide film on the sidewalls of the floating gate and the control gate, after forming a second mask on the insulating film, blanket-etching the exposed portion of the insulating film to form insulating spacers on both sidewalls of the gate electrode, after removing the second mask, forming a third mask to expose a portion of the semiconductor substrate on which a drain region will be formed and performing ion implantation process, and after removing the third mask, forming a select gate oxide film on the semiconductor substrate and then forming a select gate on the select gate oxide film.

Also, a method of manufacturing a flash memory device according to another embodiment of the present invention is characterized in that it comprises the steps of forming a gate electrode in which a tunnel oxide film, a floating gate, a dielectric film and a control gate are stacked on a semiconductor substrate and then sequentially forming a protection film and an anti-reflection preventing film on the gate electrode, forming a first mask to expose a portion of the semiconductor substrate in which a source region will be formed and performing ion implantation process, after removing the first mask, performing oxidization process to form an oxide film on the sidewalls of the floating gate and the control gate, forming a second mask to expose a portion of the semiconductor substrate in which a drain region will be formed and then performing ion implantation process, after removing the second mask, performing thermal process to form an insulating film on the entire surfaces, after forming a third mask on the insulating film, etching the insulating film to form insulating film spacers on both sidewalls of the gate electrode, and after removing the third mask, forming a select gate oxide film on the exposed portion of the semiconductor substrate, thus forming a select gate on said select gate oxide film.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
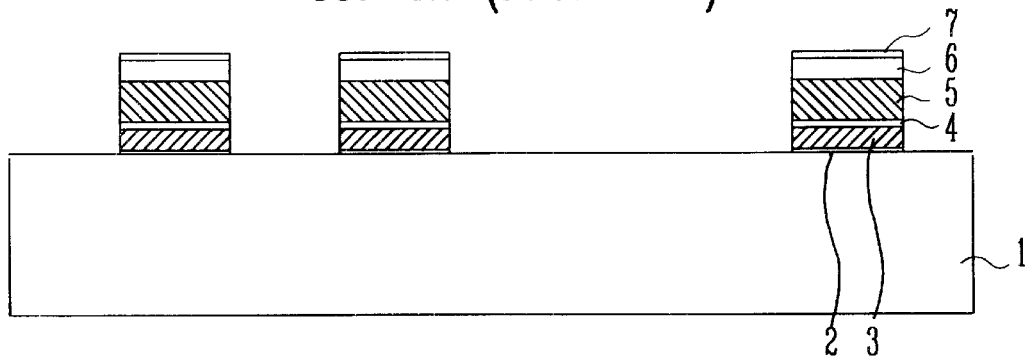
FIGS. 1A to 1G are cross-sectional views of a device for explaining a method of manufacturing a conventional flash memory device.
Figure 1B:
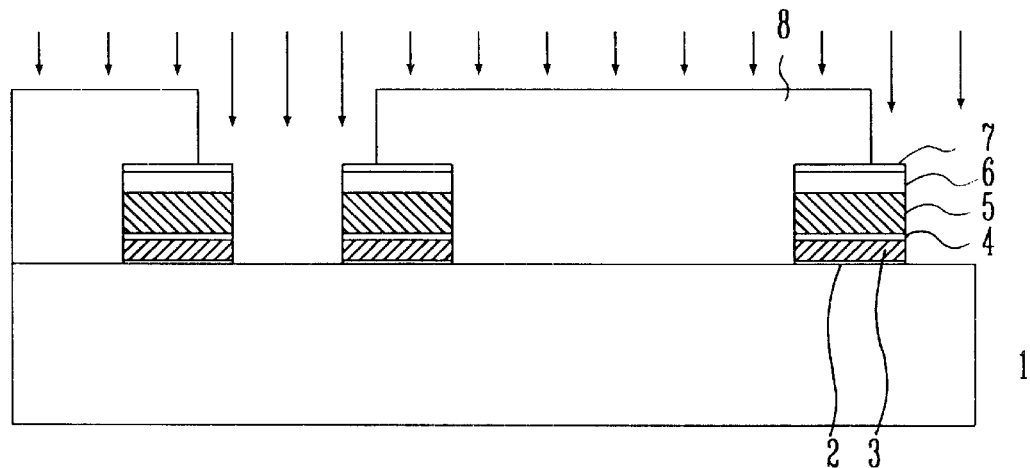
Figure 1C:
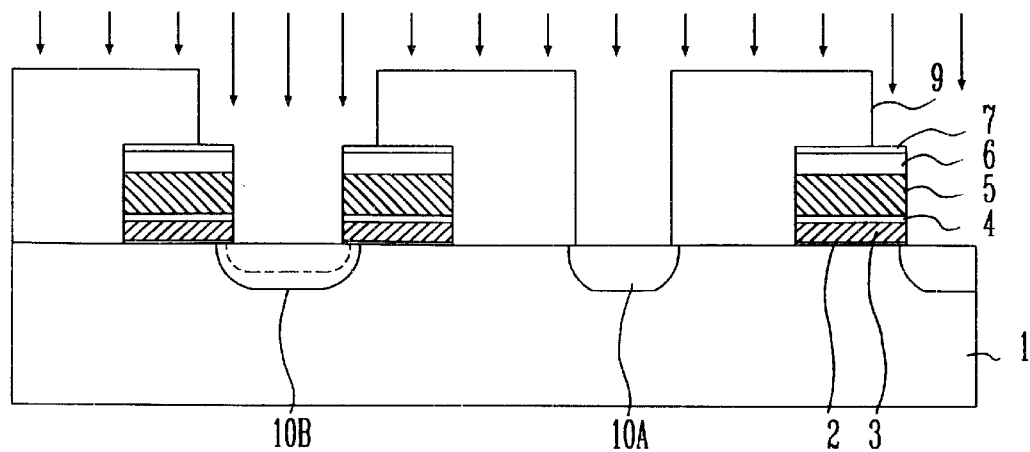
Figure 1D:
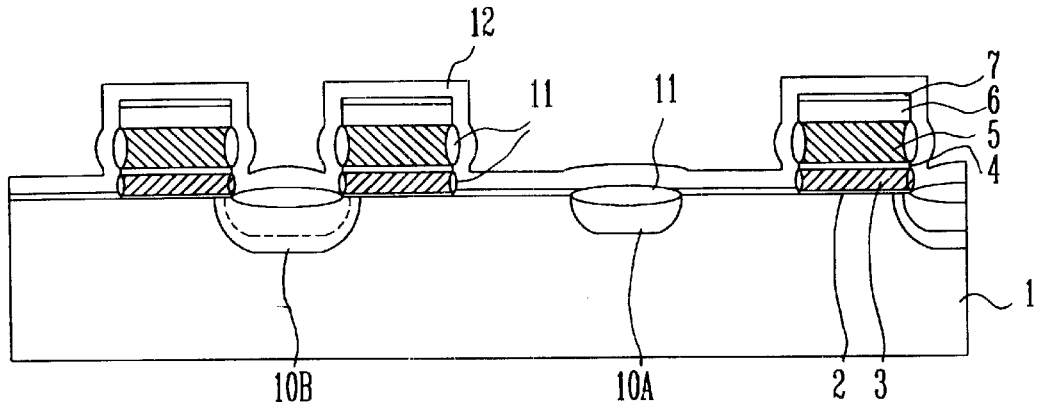
Figure 1E:
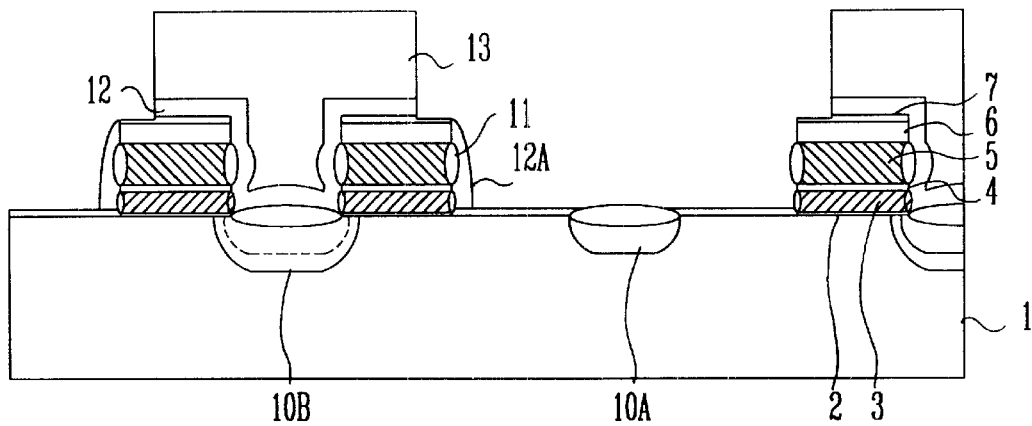
Figure 1F:
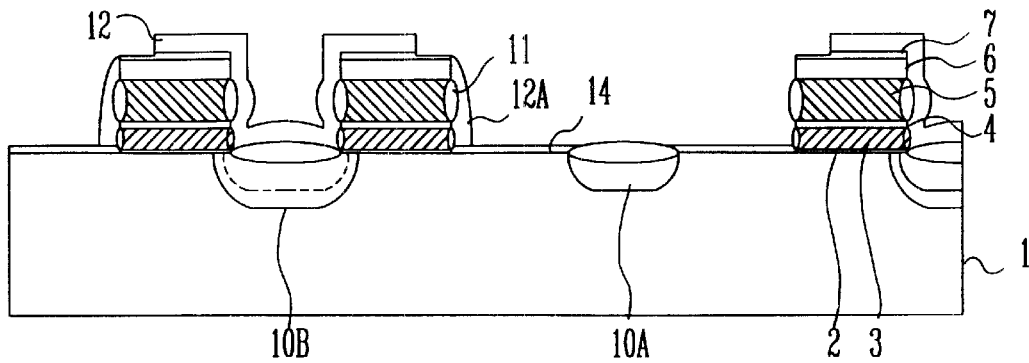
Figure 1G:
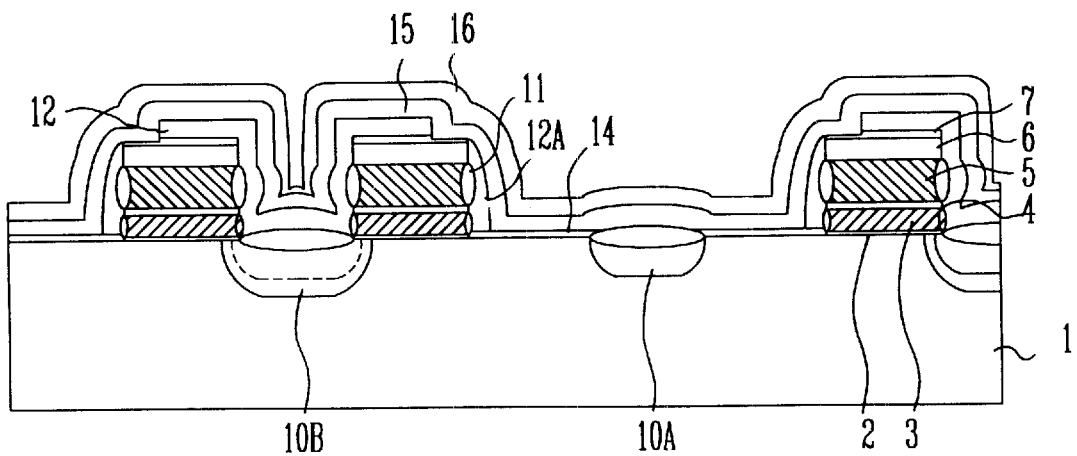
Figure 2:
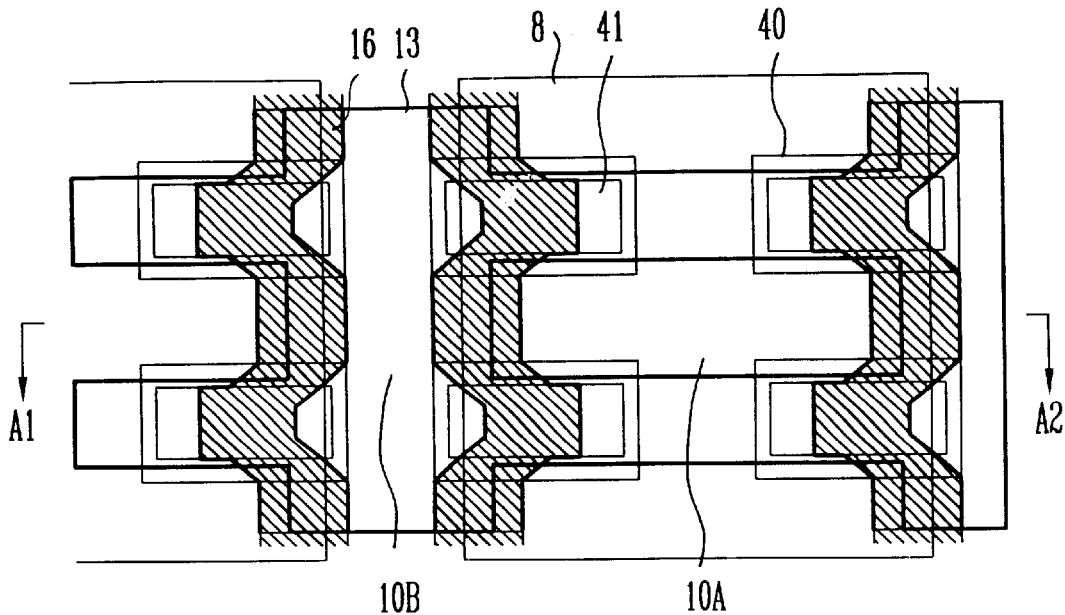
FIG. 2 shows a layout for explaining a conventional flash memory device.

The present invention will be described in detail by way of a preferred embodiment with reference to accompanying drawings, in which like reference numerals are used to identify the same or similar parts.

FIGS. 3A to 3G are cross-sectional views of a device for explaining a method of manufacturing a flash memory device according to the present invention.

Figure 3A:
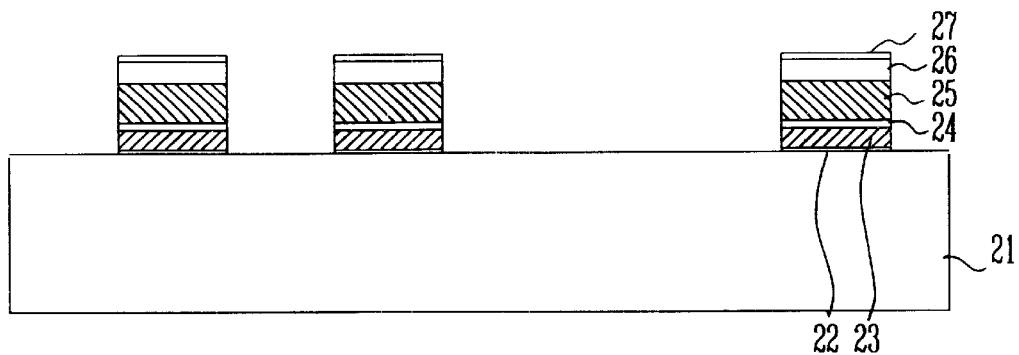
FIGS. 3A to 3G are cross-sectional views of a device for explaining a method of manufacturing a flash memory device according to the present invention.

FIG. 3A shows a cross-sectional view of a device in which after a gate electrode in which a tunnel oxide film 22, a floating gate 23, a dielectric film 24 and a control gate 25 are stacked is formed on a semiconductor substrate 21, a protection film 26 and an anti-reflection prevention film 27 are then formed on the gate electrode sequentially, wherein the protection film 26 is formed of an oxide film like TEOS and the anti-reflection prevention film 27 is formed of a nitride oxide film.

Figure 3B:
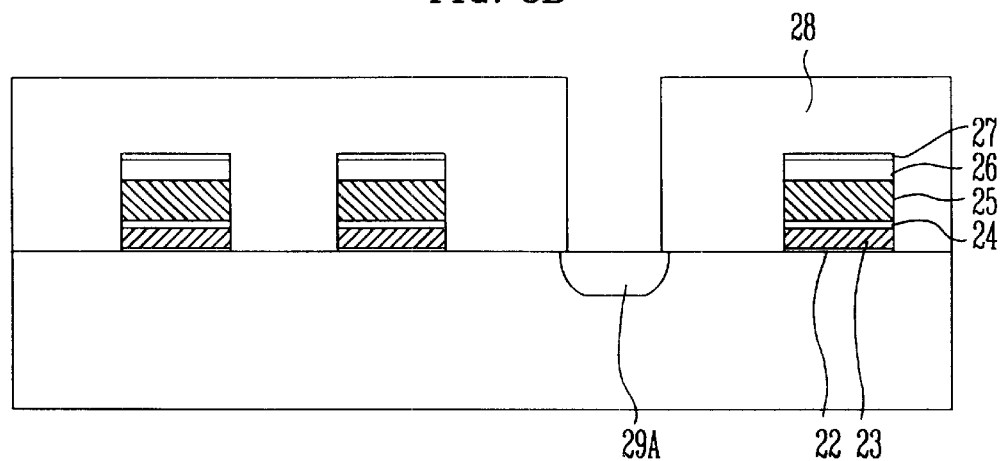

FIG. 3B shows a cross-sectional view of a device in which after a first photoresist 28 is formed, the first photoresist 28 is patterned to expose a portion of the semiconductor substrate 21 on which a source region will be formed and an impurity ion such as arsenic (As) is then implanted into the exposed portion of the semiconductor substrate 21 to form a source region 29A.

Figure 3C:
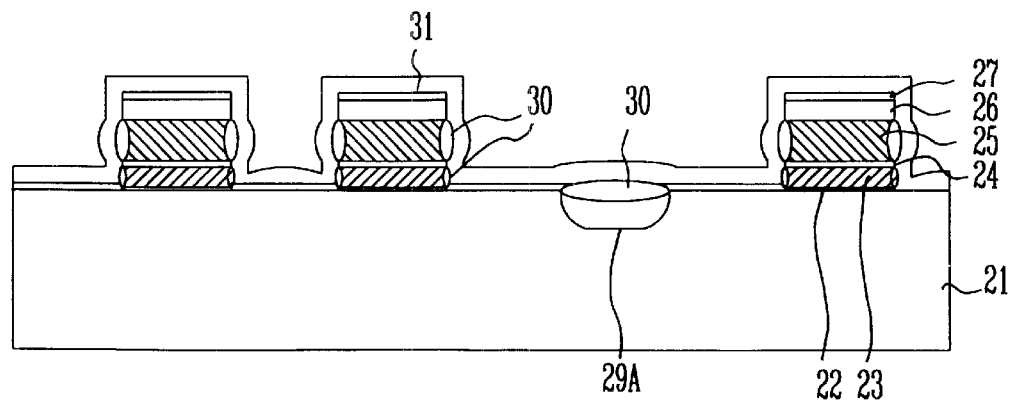

FIG. 3C shows a cross-sectional view of a device in which after the first photoresist 28 removed, an oxide film 30 is grown on the sidewalls of the floating gate 23 and the control gate 25 and on the exposed surface of the semiconductor substrate 21 to form an insulating film 31 such as a nitride film on the entire surfaces. At this time, the oxide film 30 formed on the surface of the source region 29A by the implanted ions is thicker than other portions.

Figure 3D:
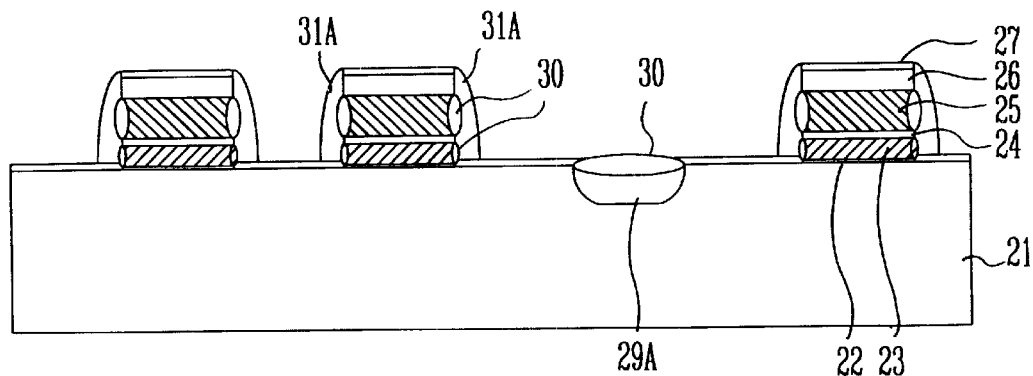

FIG. 3D shows a cross-sectional view of a device in which the insulating film 31 is etched to form insulating film spacers 31A on both sidewalls of the gate electrode. At this time, as shown in FIG. 4, a mask 52 is formed so that the source region 29A, a select channel and the gate electrode can be exposed.

Figure 3E:
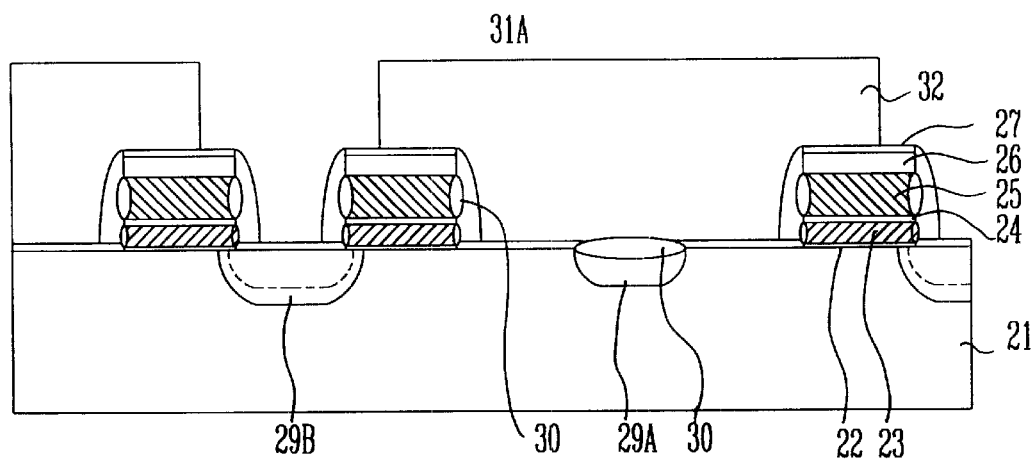

FIG. 3E shows a cross-sectional view of a device in which after the oxide film 30 remained on the semiconductor substrate 21 and the mask 52 are removed, a second photoresist 32 is formed on the entire surfaces, the second photoresist 32 is patterned to expose the portion of the semiconductor substrate 21 on which a drain region will be formed, and an impurity ion is implanted into the exposed portion of the semiconductor substrate 21, thus forming a drain region 29B having a DDD structure.

Figure 3F:
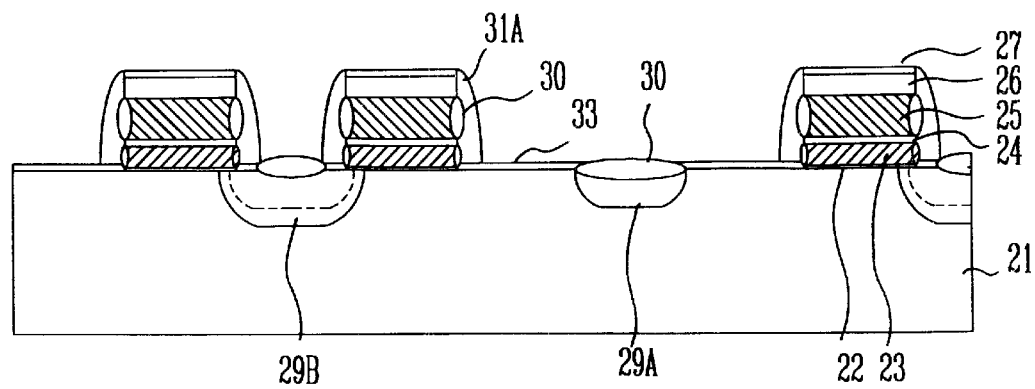

FIG. 3F shows a cross-sectional view of a device in which after the second photoresist 32 is removed, a select gate oxide film 33 is formed on the semiconductor substrate 21.

Figure 4:
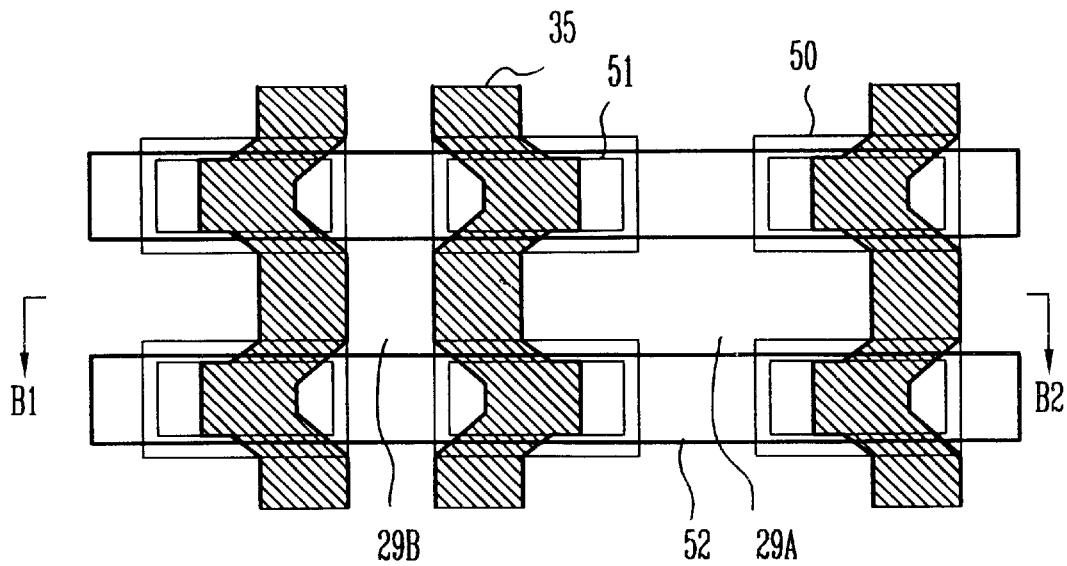
FIG. 4 shows a layout for explaining a flash memory device according to the present invention.
Figure 3G:
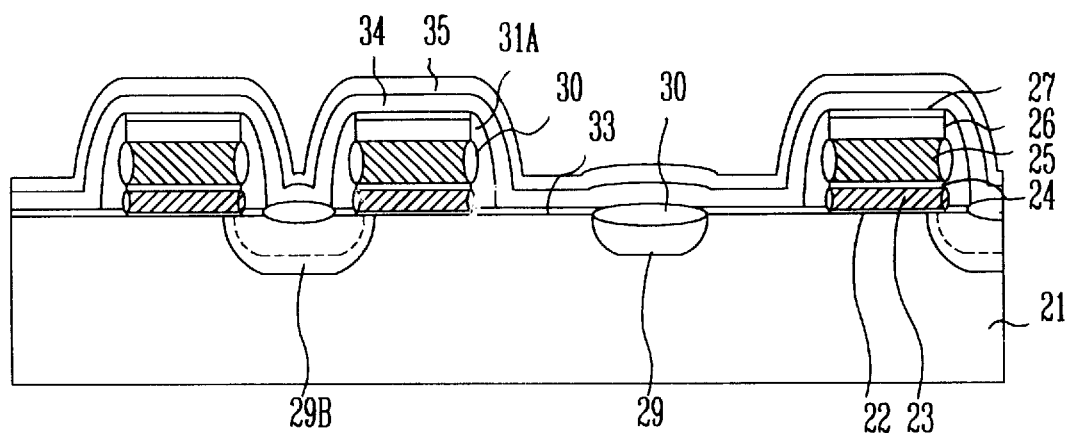

FIG. 3G show a cross-sectional view of a device taken along line B1–B2 in FIG. 4, in which polysilicon and tungsten silicide are sequentially deposited on the entire surfaces to form a select gate consisted of a polysilicon layer 34 and a tungsten silicide layer 35.

In FIG. 4, a reference numeral 50 indicates a mask for forming a device isolation film and a reference numeral 51 indicates a mask for patterning a polysilicon layer for forming a floating gate.

As above, as the insulating film spacers 31A are formed on both sidewalls of the gate electrode, a sufficient coverage can be obtained during the process of depositing the tungsten silicide, and a line width having an uniform thickness can be thus obtained. Also, during the patterning process for forming the select gate, as a little over-etch is performed in the stringer remove process performed to prevent a bridge, a stable word line resistance can be obtained even when under-cut is generated. Further, if a memory cell in which a word line has a low resistance is formed, defects due to time delay can be prevented. In case of a memory cell having a line width of 0.6 $\mu$m, the resistance of the word line represents 30~100$\Omega$/□?. According to the present invention, however, the resistance of the word line can be reduced to 20$\Omega$/□?.

Also, in the present invention, after the insulating film spacers 31A are formed, the drain region 29B is formed.

Therefore, the overlapping area of the floating gate 23 and the drain region 29B is reduced compared to the conventional one, thus improving the erase characteristic. Further, after the oxide film 30 is formed, the drain region 39B is formed. Thus, the thermal step is reduced compared to the conventional one, thus reducing the self-resistance of the drain region 29B. As a result, the present invention can improve the characteristic of the device.

As mentioned above, the present invention improves the erase characteristic by reducing the overlapping area of the floating gate 23 and the drain region 29B. If the present invention is used, however, as the size of the insulating film spacers 31A are increased, the floating gate 23 and the drain region 29B may not be overlapped. In this case, as the erase operation could not be performed, the present invention provides the following embodiment:

According to the explanation with respect to FIGS. 3A to 3C, the processes up to the process for forming the oxide film 30 is first performed. Then, the drain region 29B is formed, as shown in FIG. 3E, which is then experienced by the thermal process. Next, as shown in FIG. 3C, the insulating film 31 is blanket-etched to form the insulating film spacers 31A on both sidewalls of the gate electrode, as shown in FIG. 3D. Thereafter, the oxide film 30 remained on the semiconductor substrate 21 and the mask 52 employed upon the blanket etching process are removed to form the select gate oxide film 33 and the select gate, as shown in FIGS. 3F and 3G.

As mentioned above, the present invention can reduce the gradient of the sidewalls of the gate electrode, reduce the overlapping area of the floating gate and the drain region and increase the channel length, by forming a drain region after forming insulating film spacers on both sidewalls of a gate electrode. Therefore, as the gradient of the sidewalls of the gate electrode is reduced, coverage can be better when the tungsten silicide for forming the select gate is deposited. Thus, as the self-resistance of the select gate (word line) is effectively reduced, generation of defects due to time delay can be prevented. Also, as the overlapping area of the floating gate and the drain region is reduced, the erase characteristic of the memory cell is improved and improvement of the throughput is expected accordingly. In addition, increase in the channel length will improve the punch-through characteristic of a high-integrated device.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a flash memory device, comprising:
    providing a semiconductor substrate having a gate electrode formed thereon, the gate electrode comprising a tunnel oxide film, a floating gate, a dielectric film and a control gate stacked on the semiconductor substrate, the gate electrode further having a protection film and an anti-reflection film formed thereon;
    forming a source region in a first exposed portion of the semiconductor substrate by a first ion implantation step;
    forming an oxide film on sidewalls of said floating gate and said control gate;
    forming an insulating film over the entire surface;
    forming a drain region in an exposed second portion of the semiconductor substrate by a second ion implantation step, the drain region being formed after forming the insulating film over the entire surface;
    etching the insulating film to thereby form insulating film spacers on both sidewalls of said gate electrode; and
    forming a select gate oxide film on an exposed third portion of the semiconductor substrate and then forming a select gate on said select gate oxide film.

2. The method according to claim 1, wherein the drain region is formed before etching the insulating film.

3. The method according to claim 2, comprising the steps of:
    after forming the drain region, forming an insulating film on the entire surface via a thermal process; and
    selectively etching portions of said insulating film to thereby form the insulating film spacers.

4. The method according to claim 1, wherein the drain region is formed after etching the insulating film.

5. The method according to claim 4, comprising the steps of:
    before forming the drain region, forming an insulating film on the entire surface via a thermal process; and
    selectively etching portions of said insulating film to thereby form the insulating film spacers.

6. The method of manufacturing a flash memory device according to claim 4, wherein said insulating film is a nitride film.

7. The method of manufacturing a flash memory device according to claim 4, wherein said select gate has a structure in which polysilicon and tungsten silicide are stacked.

8. A method of manufacturing a flash memory device, comprising:
    providing a semiconductor substrate having a gate electrode formed thereon, the gate electrode comprising a tunnel oxide film, a floating gate, a dielectric film and a control gate stacked on the semiconductor substrate, the gate electrode further having a protection film and an anti-reflection film formed thereon;
    forming a source region in a first exposed portion of the semiconductor substrate by a first ion implantation step;
    forming an oxide film on sidewalls of said gate electrode;
    forming an insulating film on the resulting structure after the oxide film is formed on sidewalls of said gate electrode;
    exposing a second portion of the semiconductor substrate;
    forming a drain region in the exposed second portion of the semiconductor substrate by a second ion implantation step, the drain region being formed after the insulating film is formed on the entire resulting surface;
    etching said insulating film to thereby form insulating film spacers on both sidewalls of said gate electrode, after the drain region is formed; and
    forming a select gate oxide film on an exposed third portion of the semiconductor substrate and then forming a select gate on said select gate oxide film.

9. The method of manufacturing a flash memory device according to claim 8, wherein said insulating film is a nitride film.

10. The method of manufacturing a flash memory device according to claim 8, wherein said select gate has a structure in which polysilicon and tungsten silicide are stacked.

11. A method of manufacturing a flash memory device, comprising:

providing a semiconductor substrate having a gate electrode formed thereon, the gate electrode comprising a tunnel oxide film, a floating gate, a dielectric film and a control gate stacked on the semiconductor substrate, the gate electrode further having a protection film and an anti-reflection film formed thereon;

forming a source region in a first exposed portion of the semiconductor substrate by a first ion implantation step;

forming an oxide film on sidewalls of said gate electrode;

forming an insulating film on the resulting structure, after the oxide film is formed on sidewalls of said gate electrode;

etching said insulating film to thereby form insulating film spacers on both sidewalls of said gate electrode;

forming a drain region on an exposed second portion of the semiconductor substrate by a second ion implantation step, the drain region being formed after forming the insulating film and also after etching said insulation film, and wherein the exposed second portion is adjacent at least one of said insulating film spacers;

forming a select gate oxide film on an exposed third portion of the semiconductor substrate and then forming a select gate on said select gate oxide film.

12. The method of manufacturing a flash memory device according to claim 11, wherein said insulating film is a nitride film.

13. The method of manufacturing a flash memory device according to claim 11, wherein said select gate has a structure in which polysilicon and tungsten silicide are stacked.

* * * * *